(12) United States Patent
Wang

(10) Patent No.: US 11,537,181 B1
(45) Date of Patent: Dec. 27, 2022

(54) BAFFLE AND EXPANSION CARD AND ELECTRONIC DEVICE HAVING THE SAME

(71) Applicant: WISTRON CORP., New Taipei (TW)

(72) Inventor: Ting Yi Wang, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 17/506,727

(22) Filed: Oct. 21, 2021

(30) Foreign Application Priority Data

Aug. 18, 2021 (TW) .................................. 110130489

(51) Int. Cl.
G06F 1/18 (2006.01)
H05K 7/14 (2006.01)
(52) U.S. Cl.
CPC ........... *G06F 1/186* (2013.01); *H05K 7/1417* (2013.01); *H05K 7/1487* (2013.01)
(58) Field of Classification Search
CPC .... G06F 1/186; H05K 7/1487; H05K 7/1417; H05K 7/1405
See application file for complete search history.

(56) References Cited

U.S. PATENT DOCUMENTS

2014/0204545 A1* 7/2014 Yu ........................... G06F 1/186
361/759

FOREIGN PATENT DOCUMENTS

TW 201433244 A 8/2014

OTHER PUBLICATIONS

Chinese language office action dated May 25, 2022, issued in application No. TW 110130489.

* cited by examiner

Primary Examiner — James Wu
(74) Attorney, Agent, or Firm — McClure, Qualey & Rodack, LLP

(57) ABSTRACT

An expansion card adapted for an electronic device. The expansion card includes a circuit board and a baffle. The baffle comprises a plate part and a mount part. The plate part is fixed on the circuit board. The mount part is detachably engaged with the plate part and configured to be fixed to the electronic device so as to fix the expansion card to the electronic device.

20 Claims, 7 Drawing Sheets

BAFFLE AND EXPANSION CARD AND ELECTRONIC DEVICE HAVING THE SAME

CROSS-REFERENCE TO RELATED APPLICATIONS

This non-provisional application claims priority under 35 U.S.C. § 119(a) on Patent Application No(s). 110130489 filed in Taiwan (R.O.C.) on Aug. 18, 2021, the entire contents of which are hereby incorporated by reference.

TECHNICAL FIELD

The disclosure relates to a baffle, more particularly to a baffle with at least one removable part for adjusting the size thereof and an expansion card and an electronic device having the same.

BACKGROUND

A motherboard or riser card in a server or computer generally has at least one expansion slot thereon to provide an installation point for an expansion card to be connected. In addition to the connection for the expansion card to the expansion slot, the expansion card has a baffle plate fixed at one side thereof for fixing the expansion card in place as well as securing the electrical connection. Typically, the baffle plate is fixed to the circuit board of the expansion card via fasteners, such as screws or bolts.

To adapt the same expansion card to server casing of different heights, it needs to replace the baffle plate with one whose height can fit the server casing. However, this involves a troublesome process of removing and installing fasteners using hand tool or power tool, which leads to time-consuming work and often results in fastener missing and thereby affecting the working efficiency.

SUMMARY

Accordingly, the present disclosure provides a baffle and an expansion card and an electronic device having the same that enables a size adjustment of the baffle in a toolless manner so as to solve the aforementioned problems.

One embodiment of the disclosure provides an expansion card adapted for an electronic device. The expansion card includes a circuit board and a baffle. The baffle comprises a plate part and a mount part. The plate part is fixed on the circuit board. The mount part is detachably engaged with the plate part and configured to be fixed to the electronic device so as to fix the expansion card to the electronic device.

Another embodiment of the disclosure provides an electronic device including a casing and at least one expansion card. The expansion card includes a circuit board and a baffle. The baffle includes a plate part and a mount part. The plate part is fixed on the circuit board. The mount part is detachably engaged with the plate part and is detachably fixed to the casing.

Another embodiment of the disclosure provides a baffle adapted for a circuit board and a casing. The baffle includes a plate part configured to be fixed to a side of the circuit board and a mount part detachably engaged with the plate part and configured to be fixed to the casing.

According to the baffle, the expansion card, and the electronic device as discussed in the above embodiments of the disclosure, since the plate part and the mount part of the baffle can be assembled to each other in a toolless manner, the baffle is able to obtain a size fitting to the height of the server casing by toollessly replacing the mount part with one in a required size. Thus, the baffle of the disclosure is able to adapt the expansion card to a server casing of different heights without the use of hand tools or power tools, avoiding troublesome and time-consuming works due to using fastener, such as screws or bolts. This thereby eliminates the fastener missing problem and improves working efficiency.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
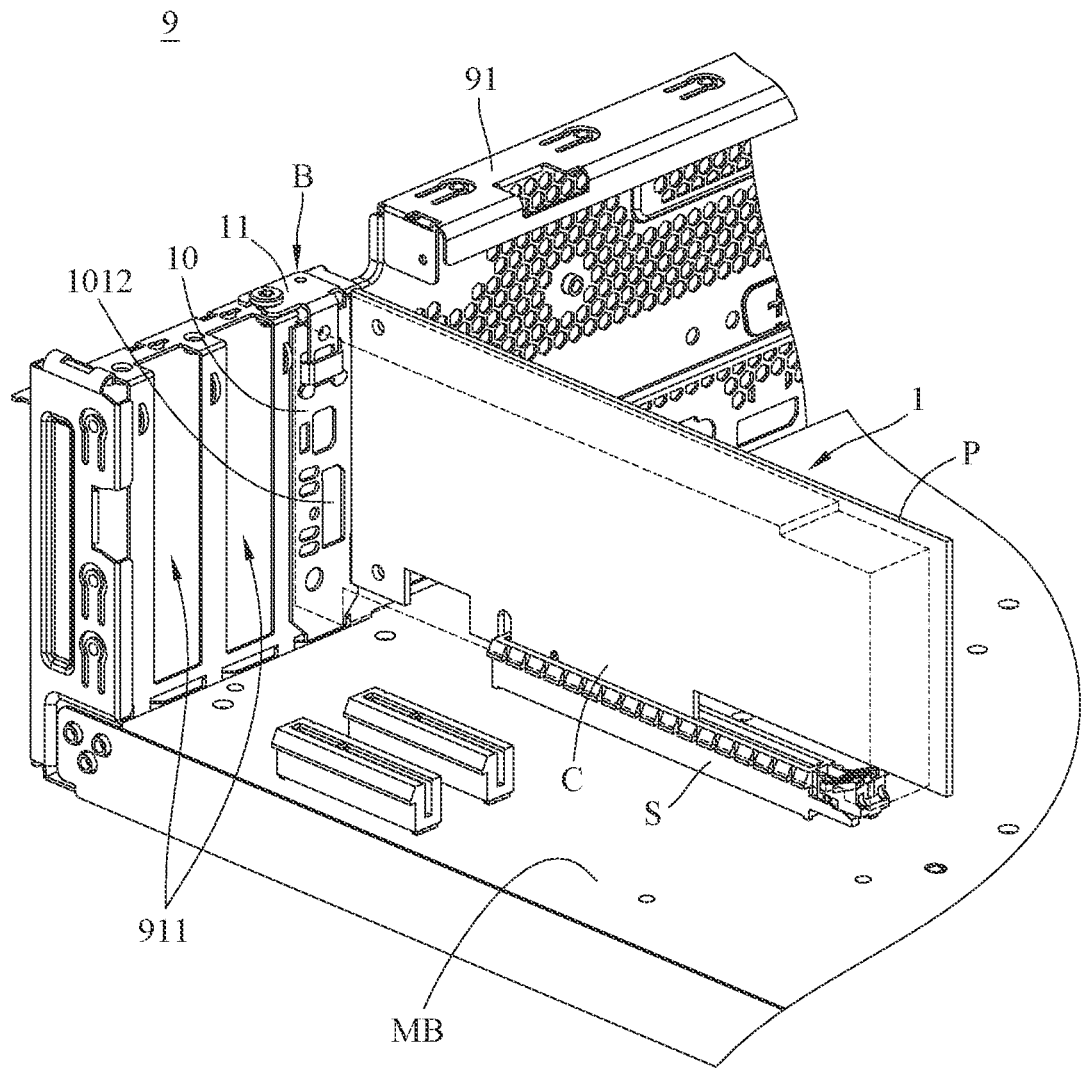
FIG. 1 is a partially enlarged perspective view of an electronic device according to one embodiment of the disclosure to show an expansion card installed in a casing thereof.

Before any embodiments of the disclosure are explained in detail, it is to be understood that the invention is not limited in its applications to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting.

Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

The following exemplary and not limiting embodiments of the disclosure will be described with reference to FIGS. 1-4B. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

Firstly, referring to FIG. 1, one embodiment of the disclosure provides an electronic device 9, the electronic device 9 may be, but is not limited to, the whole or part of a computer or a server. The electronic device may include a casing 91 and at least one expansion card 1 which is removably accommodated in the casing 91. The casing 91 may also accommodate a mainboard MB, the mainboard MB may have at least one slot S thereon for the insertion of the expansion card 1. The casing 91 and the mainboard MB may support other electric elements, modules, or assemblies but these electric elements, modules, and assemblies are omitted from drawings for the purpose of clean illustration.

The expansion card 1 may include a circuit board P and a plate part 10 connected to one side of the circuit board P. The circuit board P may have any required electric or non-electric element thereon; however, the elements on the circuit board P are not limiting, thus, to keep the drawing simple and clean, the elements on the circuit board P are simply depicted as a box in the form of dash lines.

The plate part 10 may be fixed to the circuit board P via any suitable means, such as screws, bolts, welding, or adhesive. The connection or couplings between the plate part 10 and the circuit board P is not intended to limit the disclosure.

The circuit board P has a connector C at another side thereof for electrically connecting to the slot S on the mainboard MB. As shown, the expansion card 1 can be directly electrically connected to the mainboard MB via the connector C and the slot S. Alternatively, in other embodiments, the connector C may be indirectly electrically connected to the slot S through an adapter card (not shown) inserted in the slot S. Note that the quantity and configuration of the connector C are exemplary but not limiting.

When one side of the expansion card 1 is fixed to the mainboard MB by the connector C inserting into the slot S, the other side of the expansion card 1 can be fixed in place by installing the plate part 10 to the casing 91. Herein, please further refer to FIGS. 2A-2C, a partially enlarged perspective view, assembling process, and partially enlarged planar view of the expansion card 1 are provided.

As shown, in this embodiment, the expansion card 1 may further include a mount part 11, the mount part 11 is removably disposed at one end of the plate part 10, the mount part 11 and the plate part 10 may together form an appearance similar to a typical baffle plate, thus the assembly of the plate part 10 and the mount part 11 may be referred to as a "baffle B" hereinafter.

The plate part 10 may be, but is not limited to, an integrally formed single piece of any suitable material. One end of the plate part 10 can be inserted into the casing 91, and the other end can be fixed to the casing 91 via the mount part 11, such that the plate part 10 can be firmly fixed at one of openings 911 of the casing 91. The mount part 11 can be fixed to the casing 91 via any suitable fastener (e.g., step bolt, thumb screw, or hand bolt) that can be operated without the use of hand tool or power tool. Specifically, the plate part 10 may have a main body 101 and a protrusion 102, the main body 101 means the flat and thin part of the plate part 10, and the protrusion 102 protrudes toward the elements (shown in dash lines) on the circuit board P from the inner side of the main body 101 and defines a through hole 103. The "inner side of the main body" means the side of the main body 101 facing the elements on the circuit board P. Herein, the protrusion 102 has an inner wall 1021, the inner wall 1021 means a surface of the protrusion 102 facing the inner side of the main body 101 or facing away from the elements on the circuit board P, and the inner wall 1021 surrounds and defines the through hole 103. The through hole 103 is a channel with two openings arranged along a long side of the main body 101. Note that the protrusion 102 in other embodiments may protrude from the side of the main body 101 not facing the elements on the circuit board P.

The mount part 11 may be, but is not limited to, an integrally formed single piece of any suitable material. Part of the mount part 11 is configured to be disposed through the through hole 103 and engaged with the protrusion 102. As shown, the mount part 11 may include a pluggable structure 111 and a mounting structure 112. The mounting structure 112 is at an angle to the pluggable structure 111. In this embodiment, the pluggable structure 111 and the mounting structure 112 may be substantially perpendicular to each other. The pluggable structure 111 is configured to be assembled to the plate part 10, and the mounting structure 112 is configured to be fixed to the casing 91 using any suitable fastener (e.g., step bolt, thumb screw, or hand bolt) that can be operated without the use of hand tool or power tool.

In more detail, in this embodiment, the mount part 11 may further include an extension portion 113 located between and connected to the mounting structure 112 and the pluggable structure 111, the extension portion 113 may be substantially parallel to the pluggable structure 111 but at an angle to the mounting structure 112, the pluggable structure 111 may include two elastic arms 1111, the elastic arms 1111 are connected to the mounting structure 112 via the extension portion 113. The elastic arms 1111 are respectively located at two opposite sides of the extension portion 113 and therefore are spaced apart from each other by a proper distance. The elastic deformation of the elastic arms 1111 allows the pluggable structure 111 to be plugged or inserted into the through hole 103 and engaged with the protrusion 102.

In more specific, the elastic arms 1111 may each include an arm portion 11111 and an engagement portion 11112 connected to the extension portion 113 via the arm portion 11111, the arm portions 11111 are configured to be removably inserted into the through hole 103, the arm portions 11111 are able to press against the inner wall 1021 of the protrusion 102 to make the engagement portion 11112 removably engaged with an edge 1022 of the protrusion 102. To this end, as shown, the maximum distance (e.g., "D" in FIG. 2A) between two opposite edges of the engagement portions 11112 when no external force is applied to the arm portions 11111 is at least greater than the maximum width (e.g., "W" in FIG. 2A) of the through hole 103, securing the engagement of the elastic arms 1111 with the protrusion 102. The edge 1022 means one or more narrow and thin surfaces of the protrusion 102 that are not parallel to the inner wall 1021 and facing the mounting structure 112. In addition, since the arm portions 11111 press against the inner wall 1021 of the protrusion 102 when being disposed through the through hole 103 of the protrusion 102, the pluggable structure 111 can be stably located between and clamped by the main body 101 and the protrusion 102 and thus ensuring that the mount part 11 is firmly assembled to the plate part 10.

Figure 2A:
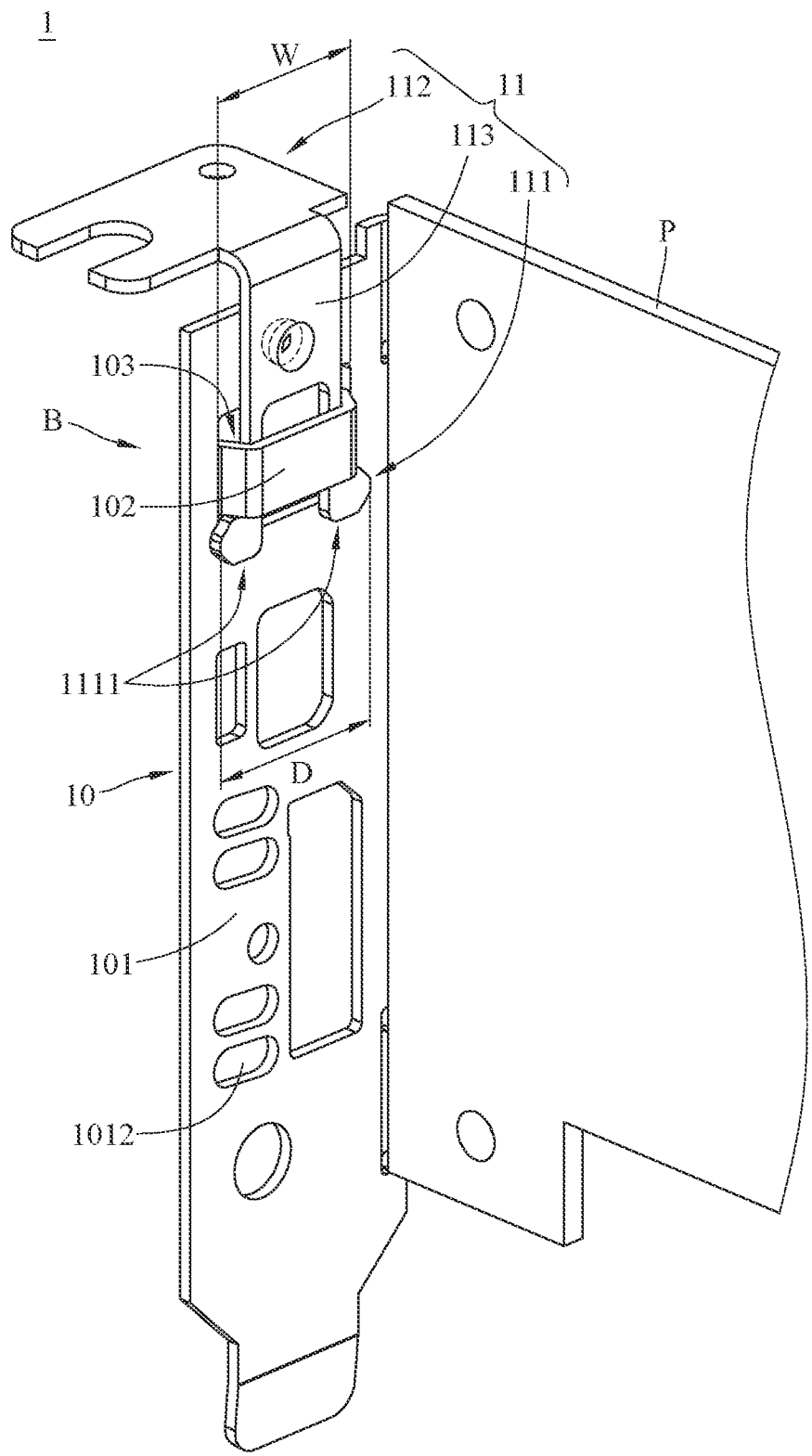
FIG. 2A is a partially enlarged perspective view of the expansion card in FIG. 1.
Figure 2B:
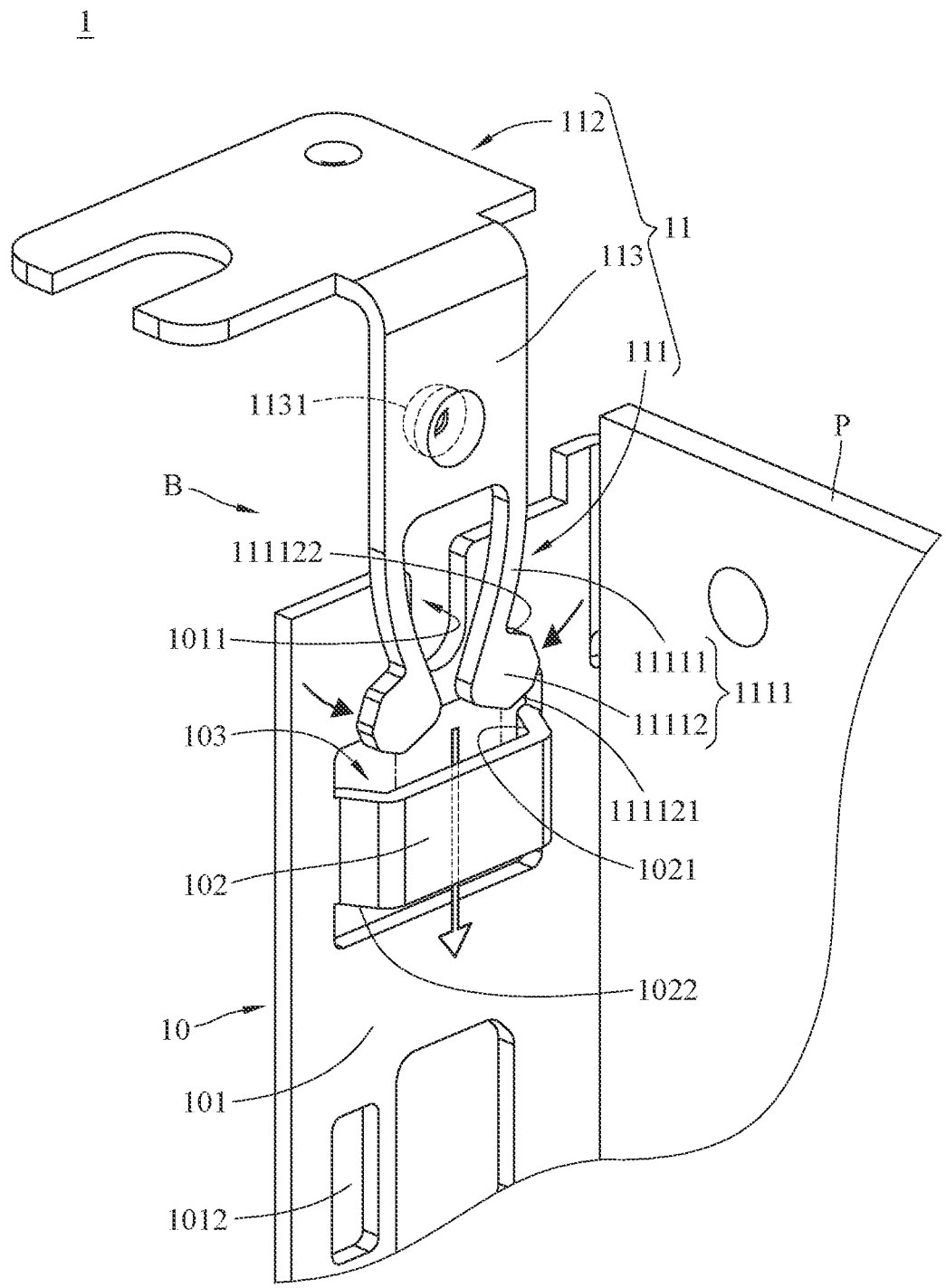
FIG. 2B depicts the assembling process of the baffle in FIG. 2A.
Figure 2C:
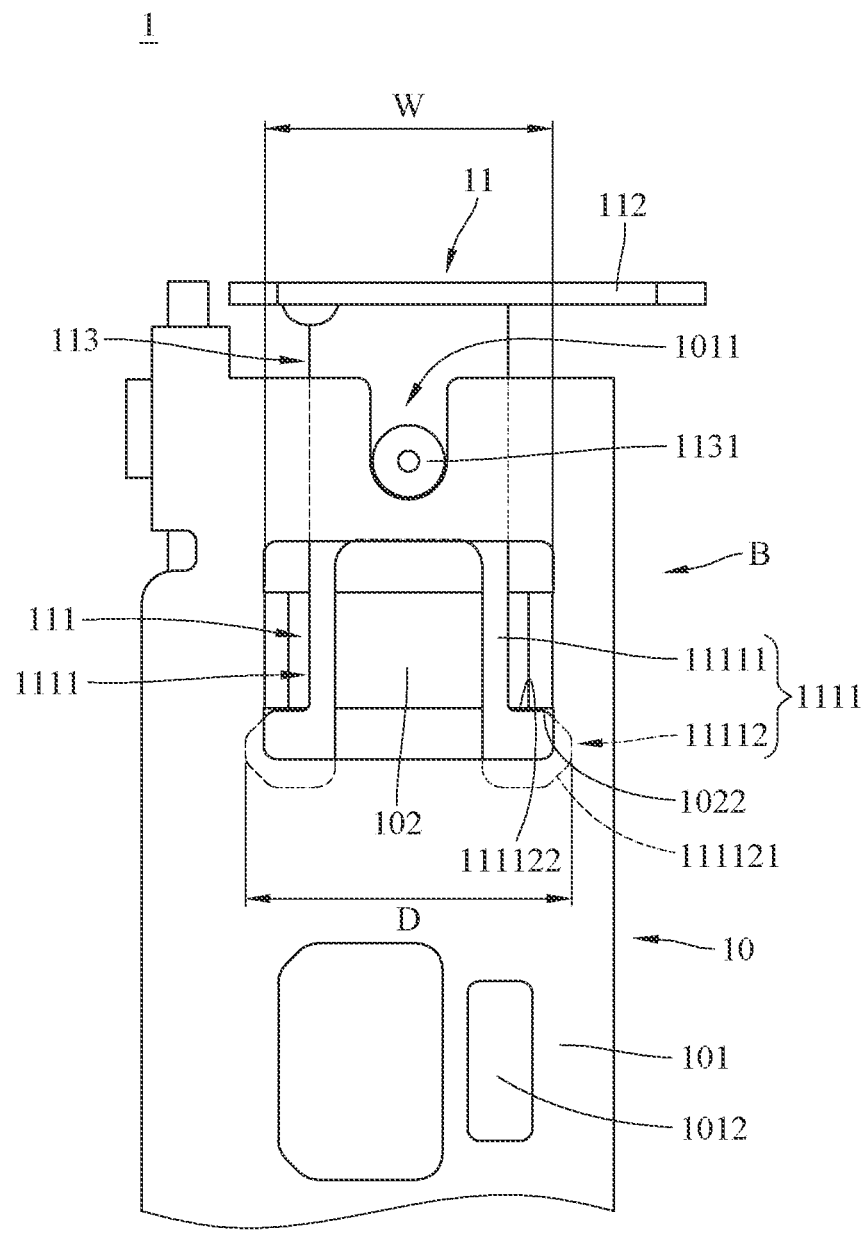
FIG. 2C is a partially enlarged planar view of the expansion card in FIG. 2A.

Then, regarding the installation of the mount part 11 to the plate part 10, as shown in FIG. 2B, by pushing the arm portions 11111 toward the protrusion 102 or deforming the arm portions 11111 by pushing the engagement portions 11112 toward each other (indicated by the arrows) directly, the pluggable structure 111 can be plugged or inserted into the through hole 103 of the plate part 10. It is to be understood that the arm portions 11111 can restore to their original positions as the engagement portions 11112 passes through the through hole 103, and the elasticity of the arm portions 11111 can keep the engagement portions 11112 engaging with the edge 1022 of the protrusion 102. Also, to facilitate the insertion of the pluggable structure 111 into the through hole 103, the engagement portions 11112 may each have an inclined guide surface 111121 located at a side thereof opposite to the other engagement portion 11112, and the inclined guide surface 111121 is at an angle to the extension direction of the arm portion 11111 when there is no external force applied thereto. Thus, the inclined guide surfaces 111121 are able to contact the protrusion 102 and guide the engagement portions 11112 to move toward each other during the insertion of the pluggable structure 111 into the through hole 103.

When the engagement portions 11112 pass through the through hole 103, the engagement portions 11112 engage with the edge 1022 of the protrusion 102. To further secure the engagement, the engagement portions 11112 may each have an engaging surface 111122 located at a side thereof away from the inclined guide surface 111121 for engaging with the edge 1022 of the protrusion 102. The engaging surface 111122 is at an angle (e.g., around 90°) to the extension direction of the arm portion 11111 when there is no external force applied thereto, thus the contact force between the engagement portion 11112 and the edge 1022 is substantially perpendicular to the engaging surface 111122. This prevents the engagement portions 11112 from detaching from the protrusion 102 due to simply pulling the mount part 11, thereby securing the engagement between the mount part 11 and the plate part 10.

In addition, in this embodiment, the main body 101 of the plate part 10 may have a first guide structure 1011, the extension portion 113 of the mount part 11 may have a second guide structure 1131, one of the first guide structure 1011 and the second guide structure 1131 is a groove extending in a direction substantially parallel to the long side of the main body 101, and the other of the first guide structure 1011 and the second guide structure 1131 is a mating protrusion slidably in the groove, the cooperation of the first guide structure 1011 and the second guide structure 1131 guides the mount part 11 in the predetermined direction during the removal and installation of the mount part 11. Note that the first guide structure 1011 and the second guide structure 1131 may be in any suitable mating shapes.

On the other hand, to remove the pluggable structure 111 from the protrusion 102, it only needs to push the engagement portions 11112 toward each other to disengage the engagement portions 11112 from the edge 1022 of the protrusion 102 and then unplug the pluggable structure 111 out of the through hole 103.

Further, optionally, the main body 101 of the plate part 10 may further have one or more through holes 1012 arranged in any required manner. The through holes 1012 may be used to expose the connector (not shown) on the circuit board P or may be used as a vent hole. To this end, it is understood that the protrusion 102 and the pluggable structure 111 are arranged at an idle area away from the connector and the through holes 1012.

As discussed, the baffle B of the expansion card 1 is an assembly of at least two pieces (i.e., the plate part 10 and the mount part 11) which can be assembled to each other in a toolless manner; that is, the baffle B is not an integrally formed single piece. Thus, although the plate part 10 and the mount part 11 are both shorter than the opening 911 of the casing 91, they can be assembled together to achieve a required size, and by replacing the plate part 10 or the mount part 11 with one in a different size, the baffle B can efficiently adapt the expansion card 1 to a server casing of a different height in a toolless manner.

Figure 3:
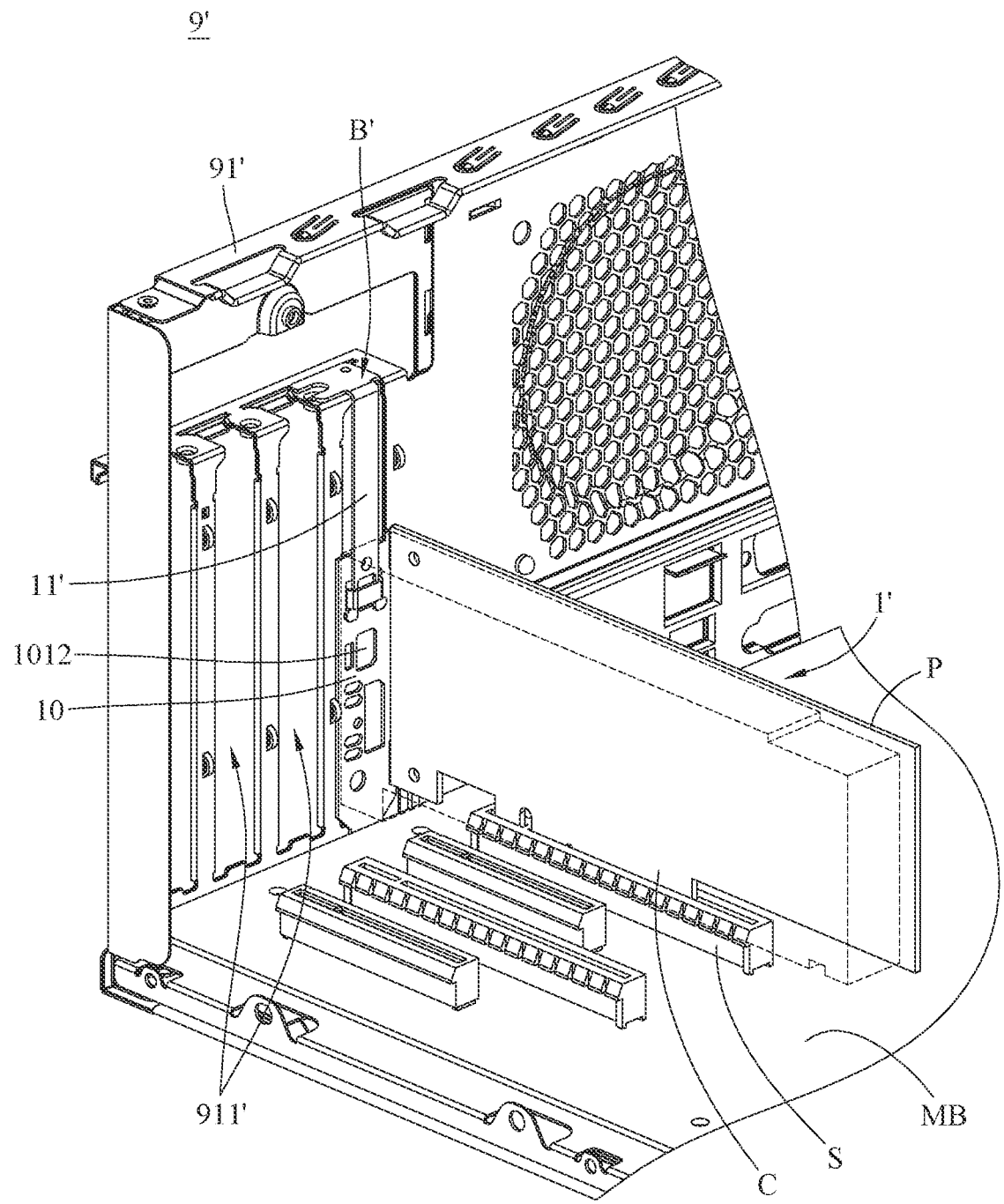
FIG. 3 is a partially enlarged perspective view of an electronic device according to another embodiment of the disclosure having a casing of a different height.
Figure 4A:
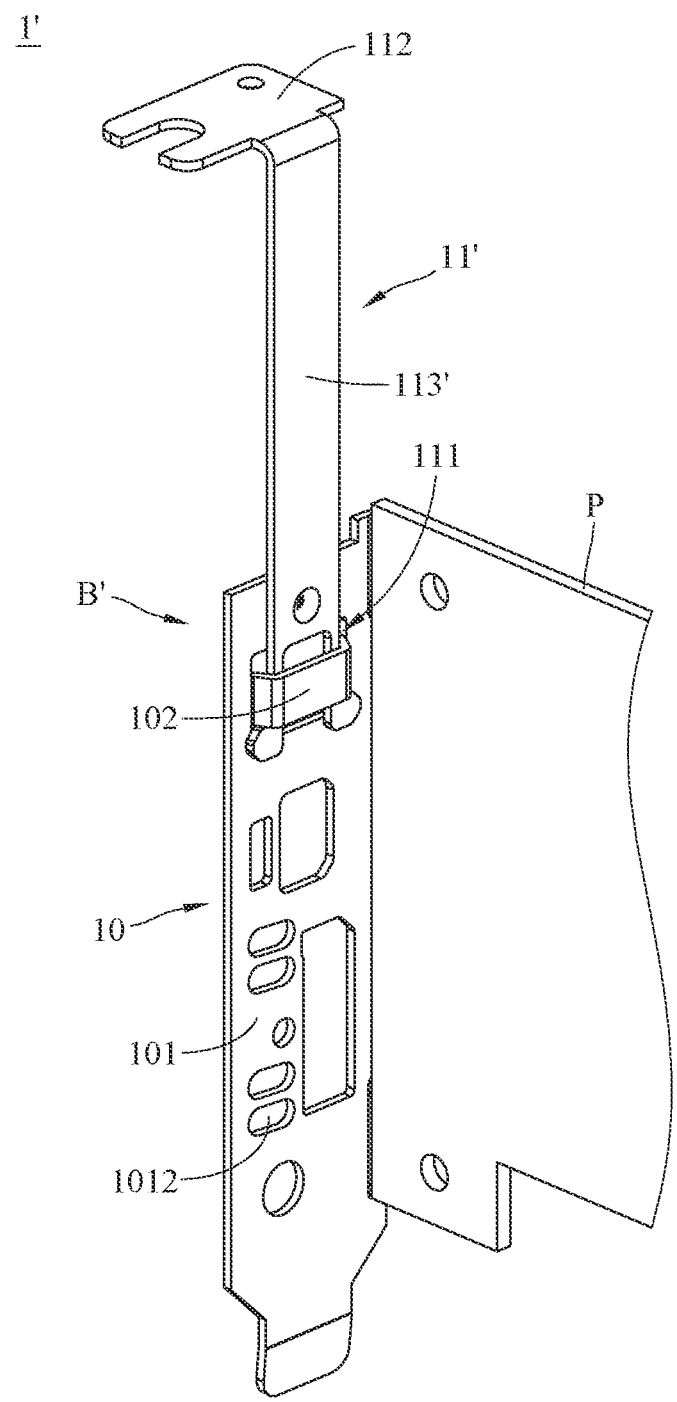
FIG. 4A is a partially enlarged perspective view of an expansion card in FIG. 3.
Figure 4B:
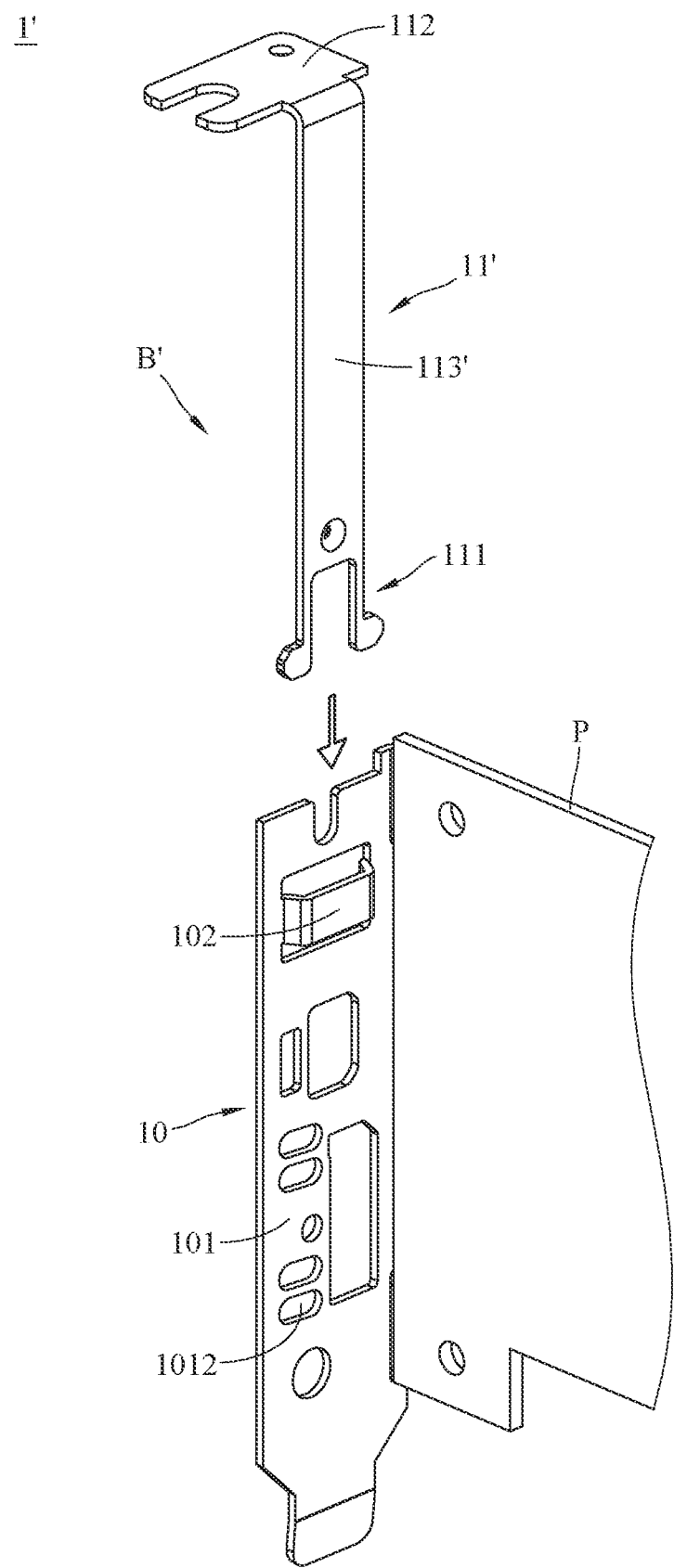
FIG. 4B depicts the assembling process of the expansion card in FIG. 4A.

For example, please see FIGS. 3-4B, another embodiment of the disclosure is provided. Note that the only differences between this and the previous embodiments are the size of the mount part and the size of the server casing, thus the rest part of the embodiment shown in FIGS. 3-4B can be comprehended with reference to the aforementioned paragraphs and will not be repeated hereinafter. As shown, a casing 91' of an electronic device 9' is taller than the casing 91 in the previous embodiment, the casing 91' has at least one taller opening 911', to adapt an expansion card 1' to the opening 911', a baffle B' is required to have a mating size. In detail, in this embodiment, the expansion card 1' adapts a mount part 11' to be assembled to the plate part 10. The mount part 11' has a configuration substantially the same as that of the aforementioned mount part 11 except for the length of its extension portion 113' is longer. Thus, the mount part 11' and the plate part 10 can together achieve a size fitting the opening 911', thus the baffle B can be fixed to two opposite ends of the opening 911' via the plate part 10 and the mount part 11'. Note that the length of the mount part of the baffle may be modified as required and is not limiting.

According to the baffle, the expansion card, and the electronic device as discussed in the above embodiments, since the plate part and the mount part of the baffle can be assembled to each other in a toolless manner, the baffle is able to obtain a size fitting to the height of the server casing by toollessly replacing the mount part with one in a required size. Thus, the baffle of the disclosure is able to adapt the expansion card to a server casing of different heights without the use of hand tools or power tools, avoiding troublesome and time-consuming works due to using fastener, such as screws or bolts. This thereby eliminates the fastener missing problem and improves working efficiency.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An expansion card, adapted for an electronic device, comprising:
    a circuit board; and
    a baffle, comprising a plate part being an integrally formed single piece and a mount part being an integrally formed single piece, wherein the plate part is directly fixed on the circuit board, the mount part comprising a mounting structure configured to be fixed to the electronic device, an extension portion at an angle to the mounting structure, and a pluggable structure parallel to the extension portion and detachably and directly engaged with the plate part.

2. The expansion card according to claim 1, wherein the plate part comprises a main body and a protrusion, the protrusion protrudes from the main body and defines a through hole, a part of the mount part is disposed through the through hole and engaged with the protrusion.

3. The expansion card according to claim 2, wherein the pluggable structure comprising the part of the mount part disposed through the through hole, the pluggable structure is at an angle to the mounting structure, the mounting structure is configured to be fixed to the electronic device, and the pluggable structure is disposed through the through hole and engaged with the protrusion.

4. The expansion card according to claim 3, wherein the extension portion is connected to and located between the mounting structure and the pluggable structure.

5. The expansion card according to claim 4, wherein the pluggable structure comprises two elastic arms spaced apart from each other and respectively located at two opposite sides of the extension portion, and the elastic arms are configured to be disposed through the through hole and engaged with the protrusion.

6. The expansion card according to claim 5, wherein the two elastic arms each comprise an arm portion and an engagement portion, the engagement portion is connected to the extension portion via the arm portion, the arm portion is disposed through the through hole of the plate part and presses against an inner wall of the protrusion so as to make the engagement portion engage with the protrusion of the plate part.

7. The expansion card according to claim 6, wherein the engagement portions of the two elastic arms each have an inclined guide surface located at sides thereof located away from each other, and the inclined guide surfaces are at an angle to an extension direction of the arm portion.

8. The expansion card according to claim 7, wherein the engagement portions of the two elastic arms each have an engaging surface located at sides thereof located away from the inclined guide surface, and the engaging surfaces are substantially perpendicular to the extension direction of the arm portion.

9. The expansion card according to claim 4, wherein the main body of the plate part has a first guide structure thereon, the extension portion of the mount part has a second guide structure thereon, one of the first guide structure and the second guide structure is a groove extending in a direction substantially parallel to a long side of the main body, and another of the first guide structure and the second guide structure is a mating protrusion slidably in the groove.

10. An electronic device, comprising:
a casing; and
at least one expansion card, comprising:
 a circuit board; and
 a baffle, comprising a plate part being an integrally formed single piece and a mount part being an integrally formed single piece, wherein the plate part is directly fixed on the circuit board, the mount part comprises a mounting structure configured to be fixed to the casing, an extension portion at an angle to the mounting structure, and a pluggable structure parallel to the extension portion and detachably and directly engaged with the plate part.

11. The electronic device according to claim 10, wherein the plate part comprises a main body and a protrusion, the protrusion protrudes from the main body and defines a through hole, a part of the mount part is disposed through the through hole and engaged with the protrusion.

12. The electronic device according to claim 11, wherein the pluggable structure comprises the part of the mount part disposed through the through hole, the pluggable structure is at an angle to the mounting structure, the mounting structure is configured to be fixed to the casing, and the pluggable structure is disposed through the through hole and engaged with the protrusion.

13. The electronic device according to claim 12, wherein the extension portion is connected to and located between the mounting structure and the pluggable structure.

14. The electronic device according to claim 13, wherein the pluggable structure comprises two elastic arms spaced apart from each other and respectively located at two opposite sides of the extension portion, and the elastic arms are configured to be disposed through the through hole and engaged with the protrusion.

15. The electronic device according to claim 14, wherein the two elastic arms each comprise an arm portion and an engagement portion, the engagement portion is connected to the extension portion via the arm portion, the arm portion is disposed through the through hole of the plate part and presses against an inner wall of the protrusion so as to make the engagement portion engage with the protrusion of the plate part.

16. The electronic device according to claim 15, wherein the engagement portions of the two elastic arms each have an inclined guide surface located at sides thereof located away from each other, and the inclined guide surfaces are at an angle to an extension direction of the arm portion.

17. The electronic device according to claim 16, wherein the engagement portions of the two elastic arms each have an engaging surface located at sides thereof located away from the inclined guide surface, and the engaging surfaces are substantially perpendicular to the extension direction of the arm portion.

18. The electronic device according to claim 13, wherein the main body of the plate part has a first guide structure thereon, the extension portion of the mount part has a second guide structure thereon, one of the first guide structure and the second guide structure is a groove extending in a direction substantially parallel to a long side of the main body, and another of the first guide structure and the second guide structure is a mating protrusion slidably in the groove.

19. The electronic device according to claim 10, wherein the casing has at least one opening, and the plate part and the mount part are respectively fixed to two opposite ends of the at least one opening.

20. A baffle, adapted for a circuit board and a casing, comprising:
a plate part being an integrally formed single piece and configured to be fixed to a side of the circuit board; and
a mount part being an integrally formed single piece and comprising a mounting structure configured to be fixed to the casing, an extension portion at an angle to the mounting structure, and a pluggable structure parallel to the extension portion and detachably and directly engaged with the plate part.

\* \* \* \* \*